(12) United States Patent
Toh et al.

(10) Patent No.: US 9,825,223 B2
(45) Date of Patent: Nov. 21, 2017

(54) FIN SELECTOR WITH GATED RRAM

(71) Applicant: GLOBALFOUNDRIES Singapore Pte. Ltd., Singapore (SG)

(72) Inventors: Eng Huat Toh, Singapore (SG); Elgin Quek, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 322 days.

(21) Appl. No.: 14/689,654

(22) Filed: Apr. 17, 2015

(65) Prior Publication Data

US 2015/0221867 A1    Aug. 6, 2015

Related U.S. Application Data

(62) Division of application No. 13/795,894, filed on Mar. 12, 2013, now Pat. No. 9,029,231.

(51) Int. Cl.
| | |
|---|---|
| H01L 47/00 | (2006.01) |
| H01L 45/00 | (2006.01) |
| H01L 27/24 | (2006.01) |

(52) U.S. Cl.
CPC ........ *H01L 45/144* (2013.01); *H01L 27/2409* (2013.01); *H01L 27/2436* (2013.01); *H01L 27/2463* (2013.01); *H01L 45/04* (2013.01); *H01L 45/06* (2013.01); *H01L 45/1206* (2013.01); *H01L 45/126* (2013.01); *H01L 45/1226* (2013.01); *H01L 45/1233* (2013.01); *H01L 45/1286* (2013.01); *H01L 45/146* (2013.01); *H01L 45/1666* (2013.01)

(58) Field of Classification Search
CPC ....................................................... H01L 47/00
See application file for complete search history.

(56) References Cited

PUBLICATIONS

I.G. Baek et al., "Highly Scalable Non-volatile Resistive Memory using Simple Binary Oxide Driven by Asymmetric Unipolar Voltage Pulses," IEEE, 2004.
I.G. Baek et al., "Multi-layer Cross-point Binary Oxide Resistive Memory (OxRRAM) for Post-NAND Storage Application", IEEE, 2005.

*Primary Examiner* — Marvin Payen
(74) *Attorney, Agent, or Firm* — Ditthavong & Steiner, P.C.

(57) ABSTRACT

A method of fabricating a fin selector with a gated RRAM and the resulting device are disclosed. Embodiments include forming a bottom electrode layer and a hardmask on a semiconductor substrate; etching the hardmask, bottom electrode layer, and semiconductor substrate to form a fin-like structure; forming first and second dummy gate stacks on first and second side surfaces of the fin-like structure, respectively; forming spacers on vertical surfaces of the first and second dummy gate stacks; forming an ILD surrounding the spacers; removing the first and second dummy gate stacks, forming first and second cavities on first and second sides of the fin-like structure; forming an RRAM layer on the first and second side surfaces of the fin-like structure in the first and second cavities, respectively; and filling each of the first and second cavities with a top electrode.

8 Claims, 6 Drawing Sheets

| Operation | BL (Sel.) | BL (UnSel.) | WL (Sel.) | WL (UnSel.) |
|---|---|---|---|---|
| Forming | $V_{form, High}$ | float | $V_{form, Sel}$ | float |
| SET | $V_{set, High}$ | float | $V_{set, Sel}$ | float |
| RESET | $V_{reset, High}$ | float | $V_{reset, Sel}$ | float |
| READ | $V_{read, High}$ | float | $V_{read, Sel}$ | float |

FIN SELECTOR WITH GATED RRAM

RELATED APPLICATION

This application is a Divisional application of U.S. patent application Ser. No. 13/795,894, filed Mar. 12, 2013, the entirety of which is incorporated herein by reference.

TECHNICAL FIELD

The present disclosure relates to semiconductor nonvolatile memories (NVMs). The present disclosure is particularly applicable to nonvolatile resistive random access memories (RRAMs).

BACKGROUND

Present floating gate flash technologies have encountered significant challenges for scaling such as scaling of program/erase (P/E) voltage, speed, reliability, number of charges stored per floating gate and their variability, and high densities with non-volatile data. Attempts to solve such issues have included employing RRAMs due to their scalability, highly competitive speed, endurance, reliability, and retention properties. However, RRAMs suffer from poor resistance uniformity, smaller memory margin, and poor performance back-end-of-line (BEOL) rectifying diode selectors.

The poor resistance distribution has been attributed to more filament current paths in a planar device, which leads to increased variations between set and reset, since some cells give more current paths than others. Single transistor single resistor (1T1R) RRAMs, which are desirably bipolar and have a high access current, also have a large cell size of $8F^2$ or higher, are not easily scalable, and have a planar memory margin. Single diode single resistor (1D1R) RRAMs, on the other hand, have a smaller cell size of $4F^2$ or higher, and are easily scalable, but are unipolar, have a low access current, and have a planar memory margin. In addition, 1D1R RRAMs employ metal oxide diodes or organic diodes, which are compatible with back-end-of-line (BEOL) processes because of processing temperatures less than 400° C. However, the diodes of such materials are not tunable, have inferior diode performance (i.e., low forward current due to large band-gap), which leads to larger cell area and a high Vdd of 3 to 4.5 V, which is not compatible with low Vdd technology.

Attempts to improve the resistance distribution include a plug bottom electrode instead of a planar bottom electrode to limit the number of filament current paths for memory cells. The plug bottom electrode improves reset current distribution and memory margin by a factor of about four. However, RRAMs using bottom plugs are not easily scalable.

A need therefore exists for methodology enabling fabrication of easily scalable RRAMs which have multi-bit capability, better rectifying property, and improved resistance distribution and memory margin, and the resulting product.

SUMMARY

An aspect of the present disclosure is a method of fabricating a fin selector with a gated RRAM.

Another aspect of the present disclosure is a fin selector with a gated RRAM.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a bottom electrode layer and a hardmask on a semiconductor substrate; etching the hardmask, bottom electrode layer, and semiconductor substrate to form a fin-like structure; forming first and second dummy gate stacks on first and second side surfaces of the fin-like structure, respectively; forming spacers on vertical surfaces of the first and second dummy gate stacks; forming an interlayer dielectric (ILD) surrounding the spacers; removing the first and second dummy gate stacks, forming first and second cavities on first and second sides of the fin-like structure; forming a RRAM layer on the first and second side surfaces of the fin-like structure in the first and second cavities, respectively; and filling each of the first and second cavities with a top electrode.

Aspects of the present disclosure include forming the RRAM layer of a transition metal. Further aspects include forming the bottom electrode to a thickness of 3 to 20 nanometers and of titanium nitride (TiN), tantalum oxide (TaN), tungsten (W), platinum (Pt), or a multilayer with an oxygen vacancies layer. Other aspects include forming an oxide on the first and second sides of the substrate of the fin-like structure prior to forming the first and second dummy gate stacks; and forming the RRAM layer on both the first and second sides of the fin-like structure in the cavity and also on a top surface of the oxide. Additional aspects include forming the RRAM layer on both the first and second side surfaces of the fin-like structure and also on a top surface of the hardmask of the fin-like structure; and forming a top electrode layer over the RRAM layer and the top electrodes in the first and second cavities. Another aspect includes forming a spacer on each of the first and second side surfaces of the semiconductor substrate of the fin-like structure prior to forming the RRAM layer; and forming the RRAM layer on each spacer and on the first and second side surfaces of the hardmask and the bottom electrode layer in the first and second cavities, respectively. A further aspect includes forming an access gate on each of the first and second sides of the fin-like structure concurrently with forming the first and second dummy gate stacks. Other aspects include forming the access gates by: forming a bottom electrode layer and a hardmask on the semiconductor substrate; forming an oxide layer on the first and second side surfaces of the fin-like structure; and forming a polysilicon gate electrode on each oxide layer.

Another aspect of the present disclosure is a device including: a semiconductor substrate; a bottom electrode layer on a semiconductor substrate; a hardmask on the bottom electrode layer, the semiconductor substrate, bottom electrode layer, and hardmask forming a fin-like structure; first and second RRAM layers on the first and second side surfaces of the fin-like structure, respectively; first and second top electrodes on the first and second RRAM layers, respectively; spacers on vertical surfaces of the first and second top electrodes; and an ILD surrounding the spacers.

Aspects include the RRAM layers including a transition metal. Additional aspects include the bottom electrode being formed to a thickness of 3 to 20 nanometers and including TiN, TaN, W, Pt, or a multilayer with an oxygen vacancies layer. Another aspect includes an oxide on the first and second sides of the substrate of the fin-like structure, and an RRAM layer on a top surface of the oxide. Further aspects include an RRAM layer on a top surface of the hardmask of the fin-like structure; and a top electrode layer over the RRAM layer and the top electrodes. Other aspects include a spacer on each of the first and second side surfaces of the semiconductor substrate of the fin-like structure, wherein the RRAM layer is formed on each spacer and on the first and second side surfaces of the hardmask and the bottom electrode layer. An additional aspect includes an access gate on each of the first and second sides of the fin-like structure. A further aspect includes the access gates including: a bottom electrode layer and a hardmask on the semiconductor substrate; an oxide layer on the first and second side surfaces of the fin-like structure; and a polysilicon gate electrode on each oxide layer.

Another aspect of the present disclosure is a method including: forming a heater layer on a semiconductor substrate; etching the heater layer and the semiconductor substrate to form a fin-like structure; forming an ILD on side surfaces of the fin-like structure; forming a $Ge_2Sb_2Te_5$ (GST) layer in contact with the heater layer; and forming a top electrode on the GST layer, forming a phase-change random access memory (PCRAM). A further aspect includes: forming a hardmask on the heater layer, forming the GST layer on a top surface of the ILD on each side of the fin-like structure and on each side surface of the heater layer and the hardmask, and forming a top electrode on each side of the fin-like structure; or forming the GST layer on the heater layer, and forming the top electrode over the GST layer and the ILD on each side of the fin-like structure.

Another aspect of the present disclosure is a PCRAM including: a semiconductor substrate; a heater layer on the semiconductor substrate, the heater layer and the semiconductor substrate forming a fin-like structure; an ILD on side surfaces of the fin-like structure; a GST layer in contact with the heater layer; and a top electrode on the GST layer. Aspects include a hardmask on the heater layer, the GST layer on a top surface of the ILD on each side of the fin-like structure and on each side surface of the heater layer and the hardmask, and a top electrode on each side of the fin-like structure; or the GST layer on the heater layer, and the top electrode over the GST layer and the ILD on each side of the fin-like structure.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 4A and 1 through 4B schematically illustrate alternative process flows for forming a fin selector with a gated RRAM, with FIGS. 3A and 4A illustrating separate gates, and FIGS. 3B and 4B illustrating a continuous gate, in accordance with an exemplary embodiment;

FIGS. 6A through 6C illustrate alternative ways of connecting circuits including gated RRAMs of FIG. 4A.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of difficult scalability, poor resistance uniformity, smaller memory margin, and poor performance BEOL rectifying diode selectors attendant upon fabricating RRAMs. In accordance with embodiments of the present disclosure, a fin selector is provided with a gated RRAM.

Methodology in accordance with embodiments of the present disclosure includes forming a bottom electrode layer and a hardmask on a semiconductor substrate, etching the hardmask, bottom electrode layer, and semiconductor substrate to form a fin-like structure, forming first and second dummy gate stacks on first and second side surfaces of the fin-like structure, respectively, forming spacers on vertical surfaces of the first and second dummy gate stacks, forming an ILD surrounding the spacers, removing the first and second dummy gate stacks, forming first and second cavities on first and second sides of the fin-like structure, forming a RRAM layer on the first and second side surfaces of the fin-like structure in the first and second cavities, respectively, and filling each of the first and second cavities with a top electrode.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 4A and 1 through 4B schematically illustrate alternative process flows for forming a fin selector with a gated RRAM, in accordance with an exemplary embodiment. Adverting to FIG. 1, a crystalline semiconductive body layer 101, for example formed of silicon (Si), is provided on a substrate (not shown for illustrative convenience). The substrate may be a silicon-on-insulator (SOI) substrate, and semiconductive body layer 101 may be formed on the buried oxide (BOX) layer of the SOI substrate, or the substrate may be formed of bulk silicon and semiconductive body layer 101 may be formed on an additional oxide (explained further below). Isolation and body doping, for example N-type doping, are performed on the semiconductive body layer 101. Next, a bottom electrode layer 103 and hardmask 105 are sequentially deposited on semiconductive body layer 101. Bottom electrode layer 103 may be formed of, for example, titanium nitride (TiN), tantalum nitride (TaN), tungsten (W), or platinum (Pt), and may be deposited to a thickness of 3 to 20 nanometers (nm). Alternatively, the bottom electrode layer 103 may be formed of a multi-layer including an oxygen vacancies layer, for example TiN and titanium (Ti) layers or TiN and hafnium (Hf) layers. The thickness of the bottom electrode layer 103 may be controlled to limit the contact area between the bottom electrode and the later formed RRAM. Smaller electrode-to-RRAM contact area limits the number of conducting filament current paths and tightens the resistance distribution, leading to an improvement of the memory window/margin.

Figure 1:
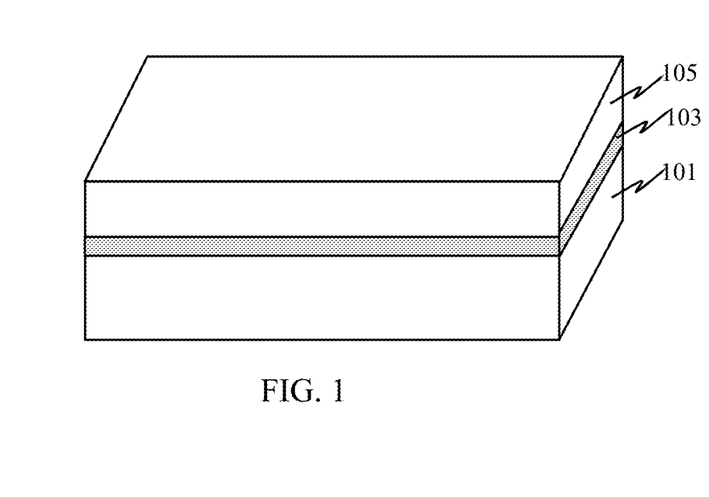
Figure 2:
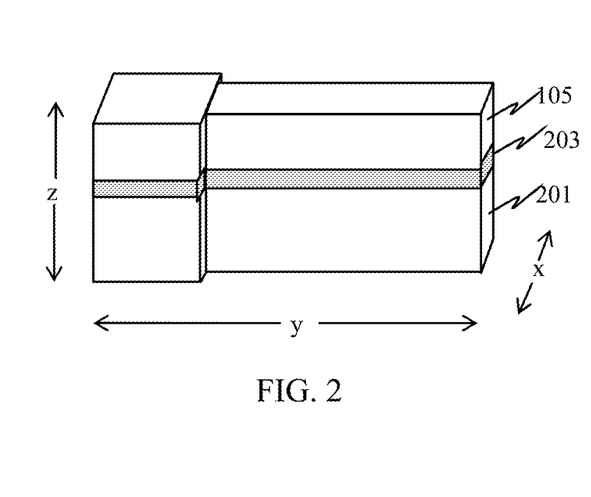

As illustrated in FIG. 2, semiconductive body layer 101, bottom electrode layer 103, and hardmask 105 are patterned and etched, e.g. lithographically, to form a fin 201 and bottom electrode 203, with hardmask 105 thereover. Fin 201 will serve as a high rectifying performance selector (e.g. diode) in the final device. The diode may be a pn or an np-type diode. In the case of a bulk silicon substrate, patterning and etching is followed by an optional bulk finfet process for isolation, which includes depositing an additional oxide around the fin, chemical mechanical polishing (CMP), and wet etching to expose bottom electrode 203 and a top of the fin 201, leaving the oxide surrounding the fin.

Figure 3A:
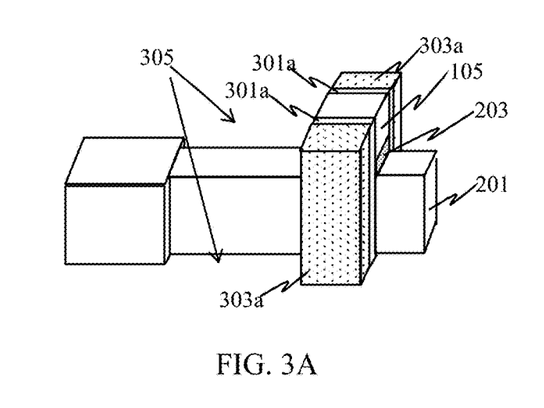
Figure 3B:
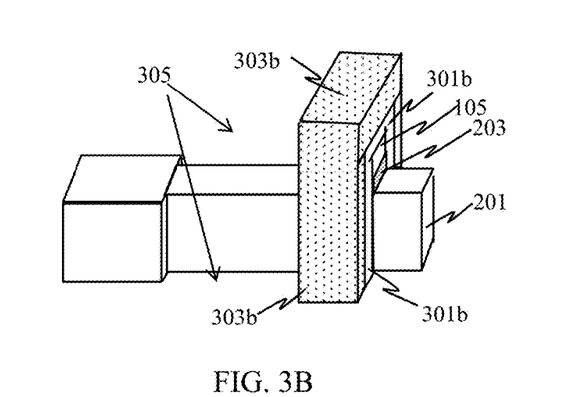

For an SOI substrate, dummy gate stacks are then formed on the BOX layer of the substrate along opposite sides of the fin and hard mask, as illustrated in FIG. 3A, or along opposite sides of the fin and on the top and side surfaces of the hardmask 105. For example, an oxide layer 301a may be deposited on the BOX layer of the substrate along vertical side surfaces of fin 201 and hardmask 105 (FIG. 3A) or an oxide layer 301b may be grown on the sides and top of hardmask 105 and sides of fin 201 (FIG. 3B). Polysilicon may then be formed on oxide layer 301a or 301b, and the dummy gate stacks may be patterned and etched to form dummy gate(s) 303a or 303b, respectively. In the case of a bulk silicon substrate, the dummy gate stacks would be formed on the additional oxide rather than on the BOX layer of the SOI substrate.

Once the dummy gate(s) are formed, implantation (e.g., P-type) may be performed for forming source/drain regions on fin 201. Then, spacers (not shown for illustrative convenience) may be formed on the vertical surfaces of the dummy gates 303a or 303b and oxide layer 301a or 303b, respectively. Next, an ILD 305 is deposited over the structure, and CMP is performed down to an upper surface of hardmask 105 (for separate gates) or down to an upper surface of dummy gate 303b (for a continuous gate).

Subsequently, a process similar to a replacement gate process is performed. Specifically, for separate gates (i.e., for independent biasing, allowing a two-bit per cell configuration), dummy gates 303a and oxide layer 301a are removed, leaving a cavity between the spacers on each side of fin 201. For a continuous gate, dummy gate 303b and oxide layer 301b are removed, leaving a cavity between spacers on each side of fin 201 and above hardmask 105. Adverting to FIG. 4A, an RRAM dielectric 401a is deposited in each cavity on side surfaces of fin 201, bottom electrode 203, and hardmask 105, and the remainder of the cavity is filled with a top electrode 403a. Alternatively, for a continuous gate, as illustrated in FIG. 4B, an RRAM dielectric 401b may be deposited in each cavity on side surfaces of fin 201 and on the top and side surfaces of hardmask 105. Then, the remainder of the cavities may be filled with a top electrode 403b. After the top electrodes are formed, conventional back-end-of-line (BEOL) processing may proceed.

Figure 4A:
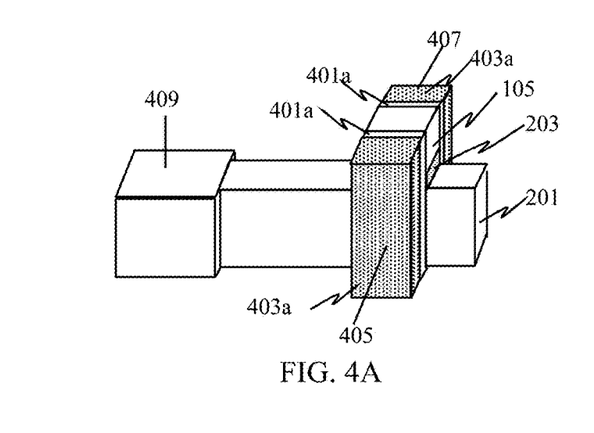
Figure 4B:
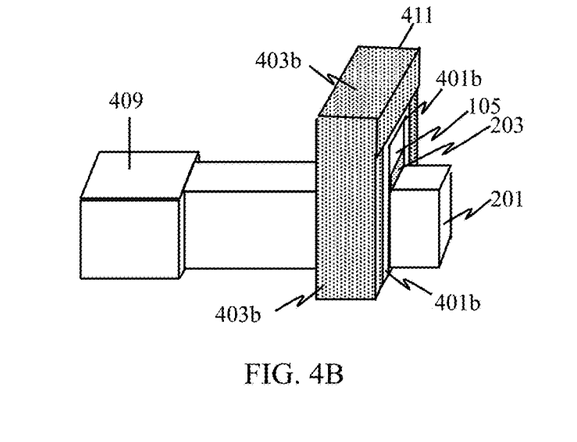

For the structures of FIGS. 4A and 4B, RRAM dielectric 401a and 401b, respectively, may be formed of nickel oxide ($NiO_x$), aluminum oxide ($AlO_x$), hafnium oxide ($HfO_x$), tungsten oxide ($WO_x$), tantalum oxide ($TaO_x$), vanadium oxide ($VO_x$), and copper oxide ($CuO_x$), or a combination thereof. Further, RRAM dielectric 401a and 401b may each be formed to a thickness of 2 to 20 nm. Top electrodes 403a and 403b may be formed of TiN, TiN and Ti, TiN and Hf, Pt, ruthenium (Ru), or nickel (Ni).

Top electrodes 403a may be connected to first and second word lines 405 and 407, respectively, for independent biasing. Further, the end of fin 201 may be connected to bit line 409. Top electrode 403b, in FIG. 4B, however, may be connected to a single word line 411.

Figure 5A:
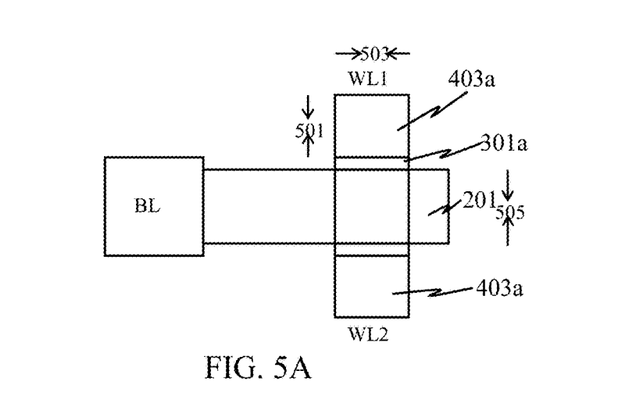
FIGS. 5A through 5C illustrate a top view, a cross-sectional view along the y-axis, and a cross-sectional view along the x-axis of the device illustrated in FIG. 4C.
Figure 5B:
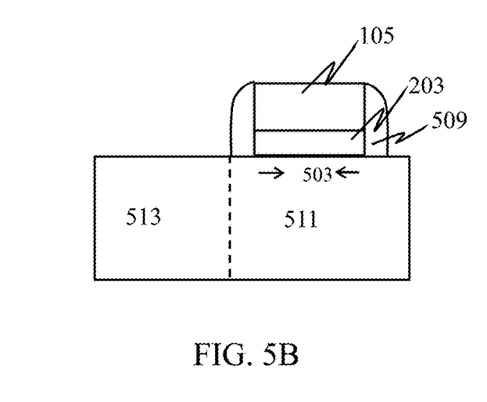
Figure 5C:
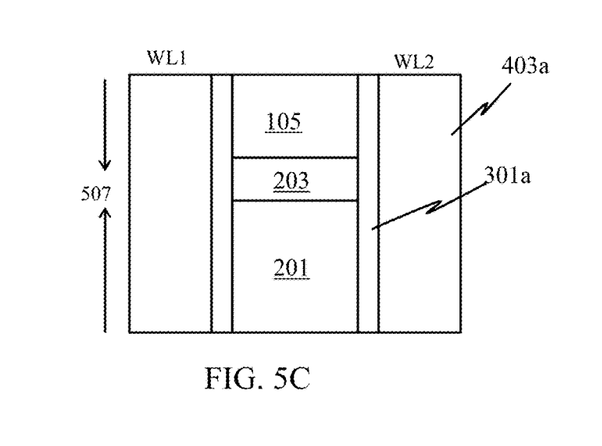

Adverting to FIGS. 5A through 5C, a top view and cross-sectional views along the y-axis and x-axis (as defined in FIG. 2), respectively, of the device of FIG. 4A are shown. As illustrated in FIGS. 5A and 5B, top electrodes 403a may have dimensions 501 and 503 in the x- and y-directions (as defined in FIG. 2), respectively, and bottom electrode 203 may have dimensions 505 and 503. For example, 501 may be 10 to 1000 nm, 503 may be 5 to 200 nm, and 505 may be 3 to 100 nm. In addition, as illustrated in FIG. 5C, top electrodes 403a may have a dimension 507 in the z-direction (as defined in FIG. 2), which may be 3 to 200 nm. For a continuous electrode, as illustrated in FIG. 4B, the additional portion of top electrode 403b, over hardmask 105 may be formed to a thickness of 10 to 100 nm. Further, as shown in FIG. 5B, spacers 509 are formed on opposite sides of bottom electrode 203 and hardmask 105. The portion 511 of fin 201 below top electrode 203 may, for example, be doped with an n-type dopant, and portion 513 may be doped with a p-type dopant.

Figure 5D:
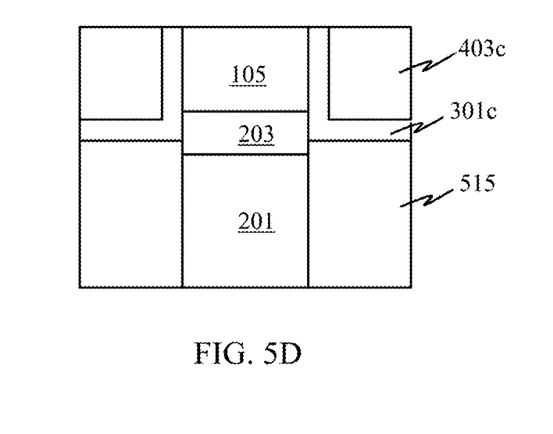
FIG. 5D schematically illustrates a cross-sectional view along the x-axis of a bulk finfet device, in accordance with an exemplary embodiment.

FIG. 5D illustrates a cross-sectional view of a bulk finfet device. As shown, ILD or isolation oxide 515 is formed on side surfaces of fin 201, as described above. During the replacement gate process, RRAM dielectric 301c may be formed on side surfaces of bottom electrode 203 and hardmask 105 as well as on a top surface of isolation oxide 515. Then, the remainder of the cavities will be formed with top electrode 403c. In this embodiment, the RRAM dielectric contacts only the bottom electrode, not the fin, as it does in FIGS. 4A and 4B.

Figure 6A:
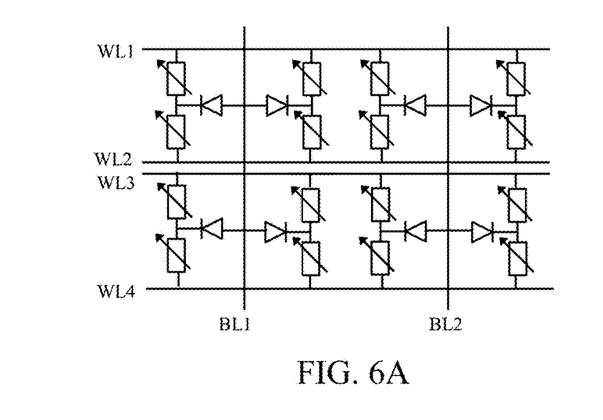
Figure 6B:
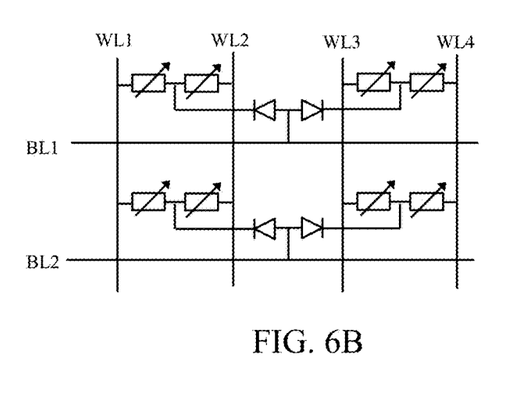
Figure 6C:
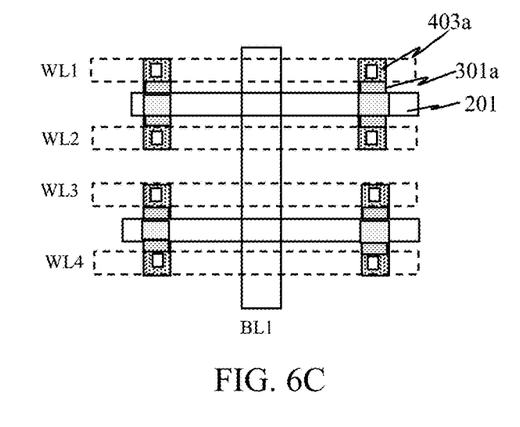
Figure 6D:
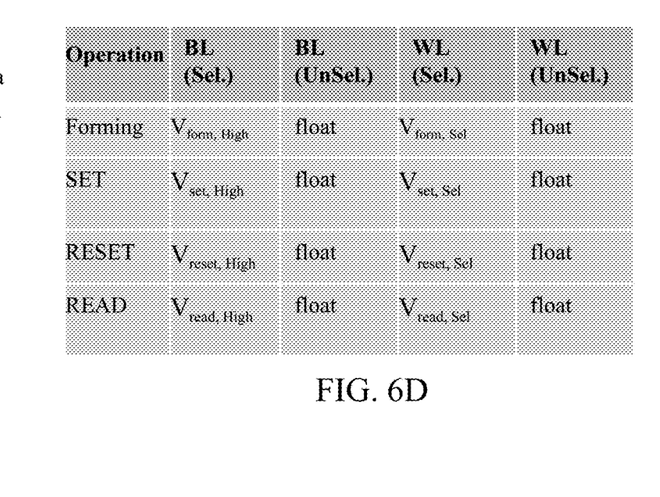
FIG. 6D is an operation table for a circuit of FIGS. 6A through 6C, in accordance with an exemplary embodiment.

FIGS. 6A through 6C schematically illustrate how multiple devices such as those shown in FIGS. 4A and 5D may be connected, with an RRAM biasing table as illustrated in FIG. 6D. As shown, two RRAM cells may be connected to word lines WL1 and WL2, respectively, with a diode selector connected to bit line BL1. For a read operation, a high read voltage may be applied to the selected bit line, and a select read voltage may be applied to the selected word line. Similarly, for a set operation, a high set voltage may be applied to the selected bit line, and a select set voltage may be applied to the selected word line. For reset operations, a select reset voltage may be applied to the selected word line, and a high reset voltage may be applied to the selected bit line. In addition, for forming operations, a high forming voltage may be applied to the selected bit line, and a select forming voltage may be applied to the selected word line. For all forming, read, set, and reset operations, unselected word lines and unselected bit lines may be floating.

Figure 7:
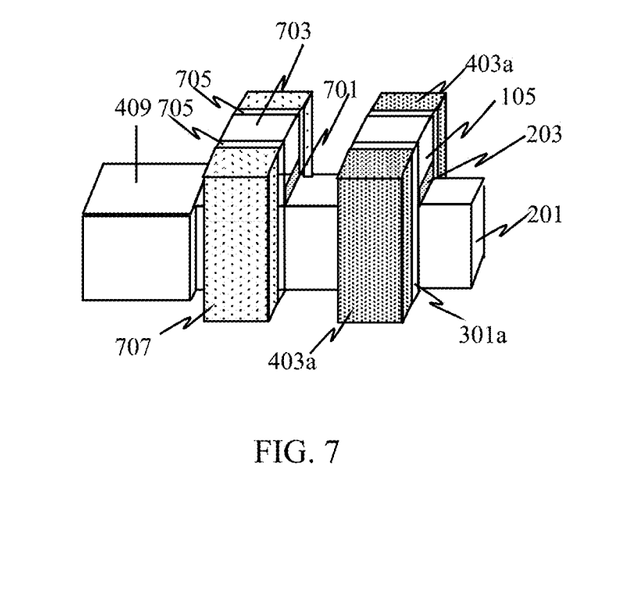
FIG. 7 schematically illustrates a device as illustrated in FIG. 4A further including an access gate, in accordance with an exemplary embodiment.

Adverting to FIG. 7, for a MOSFET selector, a polysilicon and oxide gate stack could be included as an access gate (AG) on each side of fin 201. Specifically, bottom electrode layer 701 and hardmask 703 may be formed on fin 201 with bottom electrode layer 203 and hardmask 105, respectively. Further, as oxide layer 301a is deposited, oxide 705 may also be deposited on the BOX layer of the substrate along vertical side surfaces of fin 201 and hardmask 105. Polysilicon may then be formed on both oxide layer 301a and oxide layer 705, and both stacks may be patterned and etched concurrently to form dummy gates 303a and access gates 707. Alternatively, an access gate may be formed as a continuous gate stack (not shown for illustrative convenience) with dummy gate stack 301b and 303b of FIG. 3B.

Figure 8:
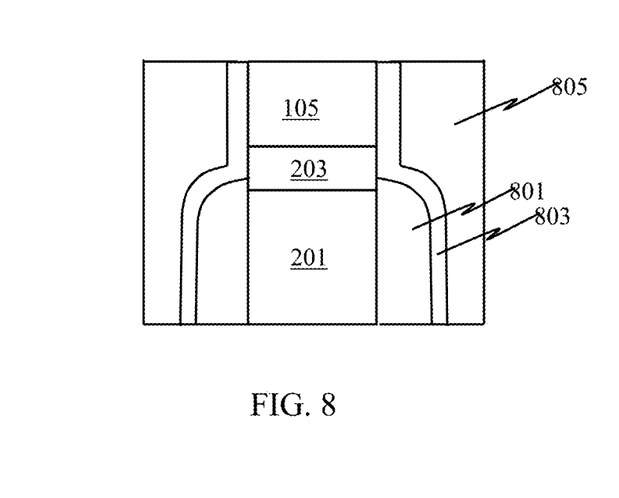
FIG. 8 schematically illustrates a cross-sectional view along the x-axis of a device as illustrated in FIG. 4A in which the RRAM only contacts the bottom electrode, in accordance with an exemplary embodiment.

Another method for preventing the RRAM from contacting the fin, other than by a bulk finfet process (as illustrated in FIG. 5D), is illustrated in FIG. 8. As shown, spacers 801 may be formed around the fin 201 either before formation of the dummy gate or after removal of the dummy, RRAM dielectric 803 may be formed on vertical surfaces of hardmask 105 and bottom electrode 203 and over spacers 801. Top electrodes 805 may then fill the remainder of the cavity on each side of fin 201.

Figure 9:
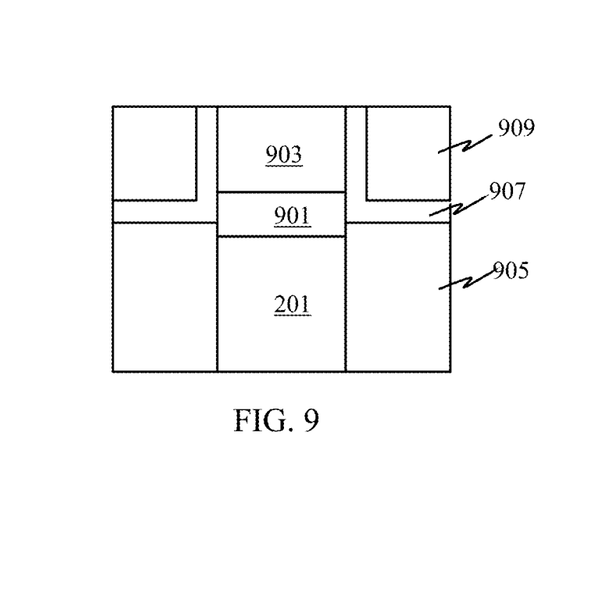
FIG. 9 schematically illustrates a cross-sectional view along the x-axis of a PCRAM with split top electrodes, in accordance with an exemplary embodiment.

The present disclosure may also be applied to phase change memory structures (PCRAMs) to achieve two bits per cell with a small contact region for reduced SET current (more effective heating) and improved variation. For example, adverting to FIG. 9, instead of a bottom electrode layer being formed on fin 201, a heater layer 901, e.g. of TaN, TiN, titanium tungsten (TiW), titanium silicon nitride (TiSiN), or tantalum silicon nitride (TaSiN), may be formed on fin 201, e.g. to a thickness of 3 to 20 nm. A hardmask 903 may then be formed on heater layer 901, and the stack may be patterned and etched to form a fin-like structure. Hardmask 903 may be formed of a good thermal insulating material, e.g. porous low-k material or airgap, to prevent heat loss. An ILD may be formed on side surfaces of fin 201, as with the bulk finfet process described above, with a top surface above the top surface of fin 201. Dummy gates, spacers, and a surrounding ILD may be formed on the ILD 905, and the dummy gates may be removed forming a cavity on each side of fin 201, as described above. A phase-change material layer, such as GST layer 907, may then be formed in each cavity on a top surface of ILD 905 and a side surface of hardmask 903 and heater layer 901. GST layer 907 may be formed to a thickness of 2 to 50 nm. The remainder of the cavity on each side of fin 201 may then be filled with a top electrode 909. Top electrodes 909 will have a thickness of 10 to 100 nm.

Figure 10:
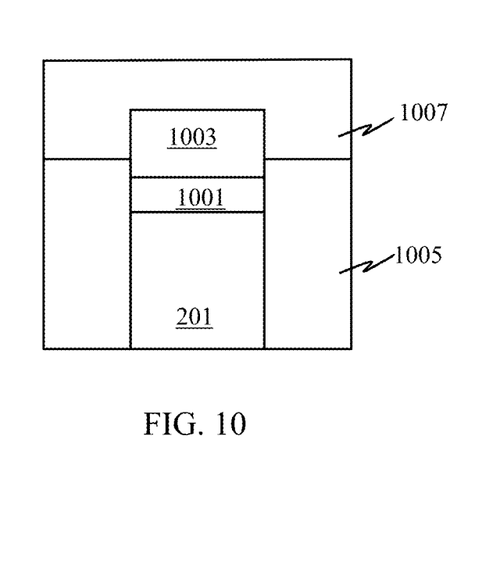
FIG. 10 schematically illustrates a cross-sectional view along the x-axis of a PCRAM with a continuous top electrode, in accordance with an exemplary embodiment.

Alternatively, a PCRAM may be formed as illustrated in FIG. 10, with a continuous top electrode. Specifically, after a heater layer 1001 is formed to a thickness of 3 to 20 nm on a fin 201, a GST layer 1003 may be formed to a thickness of 2 to 50 nm on heater layer 1001. The stack may then be patterned and etched to form a fin-like structure, and an ILD 1005 may be formed on side surfaces of fin 201, as with the bulk finfet process described above, with a top surface above a top surface of heater layer 1001. A continuous top electrode 1007 may be formed over ILD 1005 and GST layer 1003, with a thickness of 10 to 100 nm over ILD 1005 and a thickness of 3 to 5 nm over GST layer 1003.

The embodiments of the present disclosure can achieve several technical effects, such as improved scalability, multi-bit capability, improved rectifying property, and improved memory window margin controllable by bottom electrode thickness. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or in any memory product. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a semiconductor substrate;
   a bottom electrode layer on a semiconductor substrate;
   a hardmask on the bottom electrode layer, the semiconductor substrate, bottom electrode layer, and hardmask forming a fin-like structure;
   first and second resistive random access memory (RRAM) layers on the first and second side surfaces of the fin-like structure, respectively;
   first and second top electrodes on the first and second RRAM layers, respectively;
   spacers on vertical surfaces of the first and second top electrodes; and
   an interlayer dielectric (ILD) surrounding the spacers.

2. The device according to claim 1, wherein the RRAM layers comprise a transition metal.

3. The device according to claim 1, wherein the bottom electrode is formed to a thickness of 3 to 20 nanometers and comprises titanium nitride (TiN), tantalum oxide (TaN), tungsten (W), platinum (Pt), or a multilayer with an oxygen vacancies layer.

4. The device according to claim 1, further comprising an oxide on the first and second sides of the substrate of the fin-like structure, and an RRAM layer on a top surface of the oxide.

5. The device according to claim 1, comprising:
   an RRAM layer on a top surface of the hardmask of the fin-like structure; and
   a top electrode layer over the RRAM layer and the top electrodes.

6. The device according to claim 1, further comprising a spacer on each of the first and second side surfaces of the semiconductor substrate of the fin-like structure, wherein the RRAM layer is formed on each spacer and on the first and second side surfaces of the hardmask and the bottom electrode layer.

7. The device according to claim 1, further comprising an access gate on each of the first and second sides of the fin-like structure.

8. The device according to claim 7, wherein the access gates comprise:
- a bottom electrode layer and a hardmask on the semiconductor substrate;
- an oxide layer on the first and second side surfaces of the fin-like structure; and
- a polysilicon gate electrode on each oxide layer.

* * * * *